(12) United States Patent
Taoda et al.

(10) Patent No.: US 12,249,527 B2
(45) Date of Patent: Mar. 11, 2025

(54) SUBSTRATE TRANSPORT APPARATUS AND SUBSTRATE TRANSPORT METHOD

(71) Applicant: Tokyo Electron Limited, Tokyo (JP)

(72) Inventors: Isamu Taoda, Nirasaki (JP); Toshiaki Kodama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 395 days.

(21) Appl. No.: 17/661,953

(22) Filed: May 4, 2022

(65) Prior Publication Data

US 2022/0367223 A1 Nov. 17, 2022

(30) Foreign Application Priority Data

May 12, 2021 (JP) .................. 2021-081142

(51) Int. Cl.
*H01L 21/68* (2006.01)
*G01S 15/08* (2006.01)
*G01S 15/88* (2006.01)
*H01L 21/67* (2006.01)
*H01L 21/677* (2006.01)

(52) U.S. Cl.
CPC ............. *H01L 21/68* (2013.01); *G01S 15/08* (2013.01); *G01S 15/88* (2013.01); *H01L 21/67196* (2013.01); *H01L 21/67706* (2013.01); *H01L 21/6773* (2013.01); *H01L 21/67745* (2013.01); *H01L 21/67766* (2013.01)

(58) Field of Classification Search
CPC ............... H01L 21/68; H01L 21/67196; H01L 21/67706; H01L 21/6773; H01L 21/67745; H01L 21/67766; H01L 21/67265; H01L 21/67772; H01L 21/67778; H01L 21/681; H01L 21/68707; H01L 21/67201; H01L 21/67288; H01L 21/67742; H01L 21/67775; G01S 15/08; G01S 15/88; B25J 11/0095; B25J 19/026
USPC ............................................. 700/258
See application file for complete search history.

(56) References Cited

U.S. PATENT DOCUMENTS

| 9,196,518 | B1* | 11/2015 | Hofmeister | ....... H01L 21/67259 |
| 2005/0265814 | A1* | 12/2005 | Coady | ...................... H01L 21/68 414/744.5 |
| 2011/0027052 | A1* | 2/2011 | Ozawa | ..................... H01L 21/68 414/217 |
| 2011/0245964 | A1* | 10/2011 | Sullivan | ............ H01L 21/68707 700/228 |

(Continued)

FOREIGN PATENT DOCUMENTS

| JP | 2019-197799 A | 11/2019 |
| JP | 2019-212655 A | 12/2019 |
| KR | 10-2001-0075662 A | 8/2001 |

(Continued)

*Primary Examiner* — Adam R Mott
*Assistant Examiner* — Joseph Anthony Trias
(74) *Attorney, Agent, or Firm* — Armstrong Teasdale LLP

(57) ABSTRACT

A substrate transport apparatus includes: a support configured to support a substrate; a moving mechanism configured to move the support in a lateral direction in order to transport the substrate from a first placement portion to a second placement portion, each of the first placement portion and the second placement portion being configured to place thereon the substrate; and an ultrasonic sensor provided on the support and configured to detect the substrate placed on the first placement portion.

12 Claims, 15 Drawing Sheets

(56) References Cited

U.S. PATENT DOCUMENTS

2013/0116966 A1* 5/2013 D'Jesus Bencci .... H04W 64/00
  702/150
2019/0371635 A1* 12/2019 Oori ................. H01L 21/67259

FOREIGN PATENT DOCUMENTS

| KR | 10-2011-0089645 A | 8/2011 |
| KR | 10-2016-0124965 A | 10/2016 |

* cited by examiner

SUBSTRATE TRANSPORT APPARATUS AND SUBSTRATE TRANSPORT METHOD

CROSS-REFERENCE TO RELATED APPLICATION

This application is based upon and claims the benefit of priority from Japanese Patent Application No. 2021-081142, filed on May 12, 2021, the entire contents of which are incorporated herein by reference.

TECHNICAL FIELD

The present disclosure relates to a substrate transport apparatus and a substrate transport method.

BACKGROUND

In a semiconductor device manufacturing process, a semiconductor wafer (hereinafter, referred to as a "wafer"), which is a substrate, is stored in a transport container and transported in a factory. Then, in a substrate processing apparatus at a transport destination, the substrate is taken out from the transport container by a transport mechanism and processed. In Patent Document 1, a transport mechanism (a transport arm) including a substrate holding member and a height sensor provided on the bottom surface of the substrate holding member is described. In addition, Patent Document 1 discloses detecting, by using the height sensor, the position of a support ring which surrounds a table for supporting a substrate for processing the substrate and is disposed below the substrate holding member.

PRIOR ART DOCUMENT

Patent Document

Patent Document 1: Japanese Laid-Open Patent Publication No. 2019-212655

SUMMARY

According to one embodiment of the present disclosure, there is provided a substrate transport apparatus including: a support configured to support a substrate; a moving mechanism configured to move the support in a lateral direction in order to transport the substrate from a first placement portion to a second placement portion, each of the first placement portion and the second placement portion being configured to place thereon the substrate; and an ultrasonic sensor provided on the support and configured to detect the substrate placed on the first placement portion.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
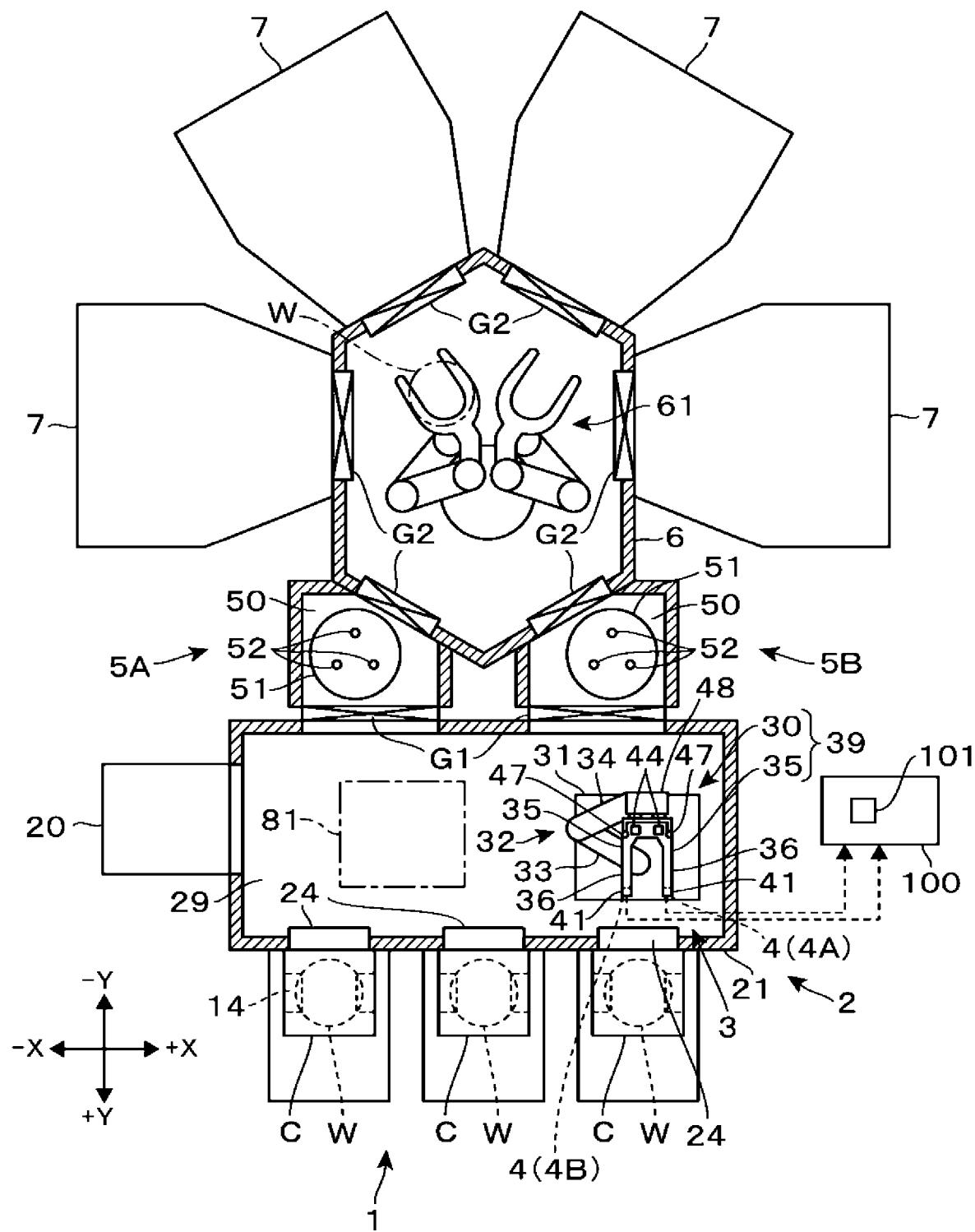
FIG. 1 is a plan view of a substrate processing apparatus to which a substrate transport apparatus according to an embodiment of the present disclosure is applied.

FIG. 1 illustrates a substrate processing apparatus 1 including a substrate transport apparatus according to an embodiment of the present disclosure. The substrate processing apparatus 1 includes a loader module 2, an alignment module 20, load-lock modules 5A and 5B, a vacuum transport module 6, and four processing modules 7, and processes a wafer W which is a circular substrate.

The loader module 2 is a module called an equipment front end module (EFEM), and has a role of taking out a wafer W from a transport container C called a front open unified pod (FOUP) that stores the wafer W and introducing the wafer W into the substrate processing apparatus 1. The loader module 2 of the present embodiment is horizontally long and has an air atmosphere and a normal pressure atmosphere inside. Hereinafter, the configuration of the substrate processing apparatus 1 will be described assuming that, in the lateral direction, the length direction of the loader module 2 is the X direction and the direction orthogonal to the X direction is the Y direction. In addition, one side and the other side in the X direction are described as the +X side and the −X side, respectively, and one side and the other side in the Y direction are described as the +Y side and the −Y side, respectively.

The alignment module 20 is connected to the loader module 2 on the −X side. The alignment module 20 includes a rotatable stage, and light is emitted to the peripheral edge of a wafer W placed on and rotated by the stage, whereby detection of the position of the peripheral edge is performed. The transport mechanism 3 to be described later receives the wafer W according to the center position of the wafer W acquired from the position of the detected peripheral edge. The transport mechanism 3 is an embodiment of the substrate transport apparatus.

The load-lock modules 5A and 5B are provided on the −Y side of the loader module 2, and the load-lock modules 5A and 5B are separated from each other in the X direction. In order to transport a wafer W between the loader module 2 and the vacuum transport module 6 to be described later, each of the load-lock modules 5A and 5B includes an internal space 50 of which is configured to be switchable between, for example, a normal pressure atmosphere of a nitrogen ($N_2$) gas atmosphere and a vacuum atmosphere.

The load-lock modules 5A and 5B have the same configuration as each other, and a stage 51 is provided in the internal space 50 of each of the load-lock modules 5A and 5B. The stage 51 includes three lifting pins 52 capable of freely protruding and sinking from the top surfaces of the stage 15, and a wafer W is delivered between the transport mechanisms 3 and 61 to be described later and the stage 51 via the lifting pins 52. A gate valves G1 is interposed between each load-lock module 5A or 5B and the loader module 2.

On the −Y side of the load-lock modules 5A and 5B, the vacuum transport module 6 having a vacuum atmosphere inside is provided, and the vacuum transport module 6 includes a transport mechanism 61. The four processing modules 7 are disposed to surround the vacuum transport module 6, and a gate valve G2 is interposed between each processing module 7 and the vacuum transport module 6. The processing modules 7 are apparatuses for processing a wafer W in a vacuum state, and are configured as film forming modules in the present embodiment. Each processing module 7 includes a stage configured to mount and heat a wafer W thereon. The stage is provided with, for example, an electrostatic chuck, and the wafer W is attracted to the electrostatic chuck. A processing gas is supplied to the wafer W attracted in this way, and a film is formed on the surface of the wafer W.

The wafer W introduced into the loader module 2 from the transport container C is processed by being transported in the order of the alignment module 20, the loader module 2, the load-lock module 5A, the vacuum transport module 6, and the processing module 7. Then, the processed wafer W is transported in the order of the processing module 7, the vacuum transport module 6, the load-lock module 5B, the loader module 2, and the transport container C. The transport of the wafer W among the load-lock modules 5A and 5B, the vacuum transport module 6, and the processing modules 7 is performed by the transport mechanism 61 of the above-described vacuum transport module 6. The transport of the wafer W among the transport container C, the alignment module 20, the loader module 2, and the load-lock modules 5A and 5B is performed by the transport mechanism 3 provided in the loader module 2. The transport mechanism 3 will be described later. When transporting the wafer W by the above routes, the gate valves G1 and G2 are opened only when necessary, and both are closed while the pressures in the load-lock modules 5A and 5B are being switched.

Figure 2:
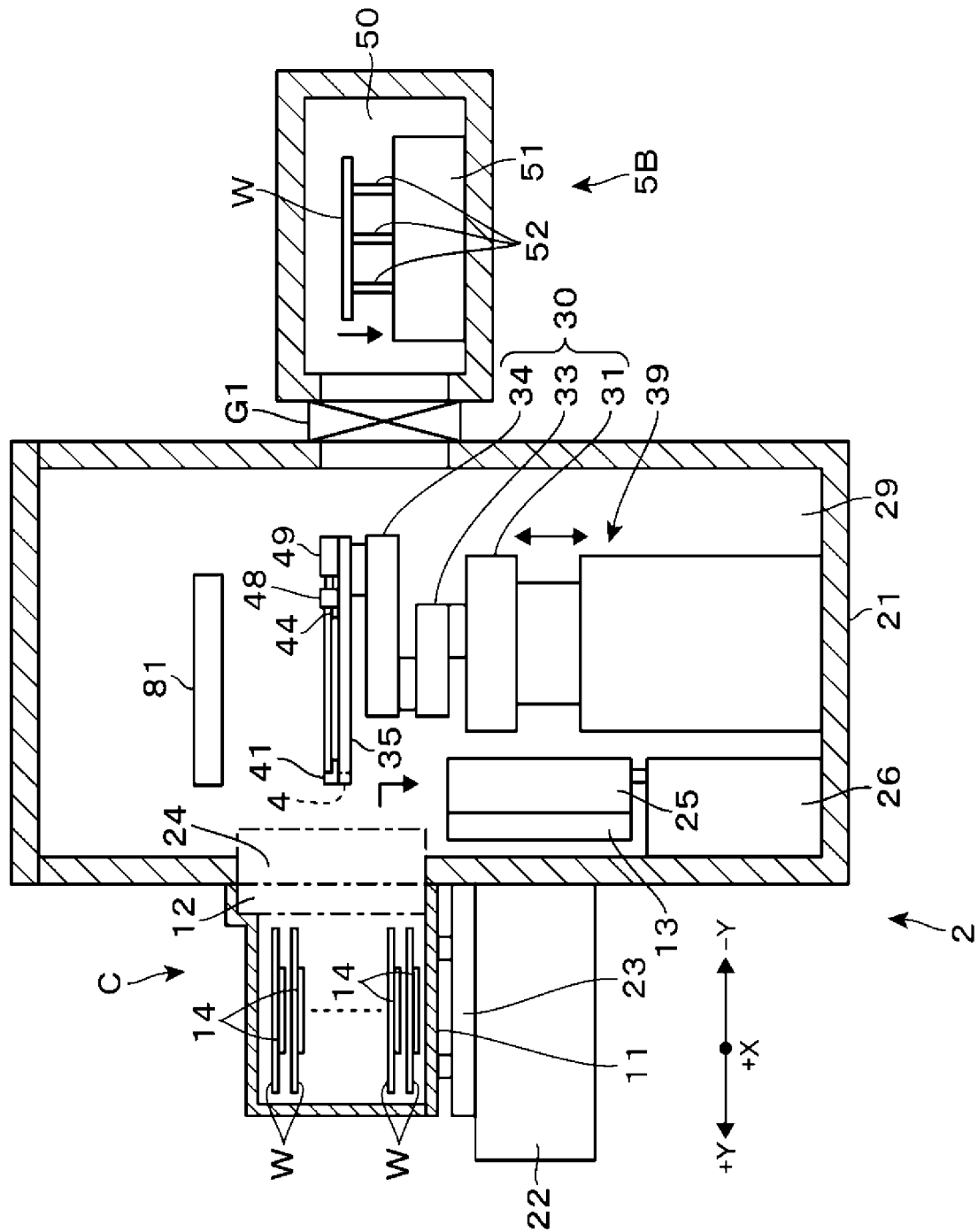
FIG. 2 is a vertical cross-sectional side view of the substrate processing apparatus.

Subsequently, the loader module 2 will be described in detail with reference to the vertical cross-sectional side view of FIG. 2. The loader module 2 includes a housing 21. The interior of the housing 21 is configured as a transport region 29 of a wafer W, and the transport region 29 has a normal pressure and an air atmosphere as described above. On the side surface of the housing 21 on the +Y side, for example, three pedestals 22 are provided to protrude from the side surface in the +Y direction, and the pedestals 22 are separated from each other in the X direction. A stage 23 is provided on each pedestal 22, and a transport container C is placed on the stage 23.

The transport container C will be described below, wherein each direction in the description is each direction in the state of being placed on the stage 23. The transport container C includes a container main body 11 and a lid 13 for closing an opening 12 provided on the side surface of the container main body 11 on the −Y side. A large number of supports 14, each of which supporting the edge portion of the rear surface (the bottom surface) of a wafer W, are provided on the −X side and the +X side in the container main body 11 at intervals in the vertical direction. Therefore, a large number of wafers W (e.g., 25 wafers W) are supported in the container main body 11 at intervals in the vertical direction and arranged in a shelf shape. The regions in the container main body 11 in which respective wafers W are supported are defined as slots, and may be numbered as slot 1, slot 2, slot 3, . . . in order from the top.

On the side surface of the housing 21 of the loader module 2 on the +Y side, three carry-in/out ports 24 of the wafer W are provided to be spaced apart from each other in the X direction, and a door 25 for closing each carry-in/out port 24 from the inside of the housing 21 is provided. The door 25 is connected to a door moving mechanism 26. The carry-in/out port 24 is opened to overlap the opening 12 of a transport container C placed on the stage 23. Then, the door 25 is retractable to a position below the carry-in/out port 24 within the housing 21 by the door moving mechanism 26 in the state of holding the lid 13 of the transport container C. Therefore, the door 25 opens/closes the carry-in/out port 24 and also opens/closes the opening 12 of the transport container C. Wafers W can be transported between the loader module 2 and the transport container C in the state in which both the opening 12 and the carry-in/out port 24 are opened.

A transport mechanism 3 is provided in the housing 21. The transport mechanism 3 includes a lifting mechanism 31 that is movable in the X direction, an articulated arm 32, and an ultrasonic sensor 4, and the articulated arm 32 is movable upward and downward by the lifting mechanism 31. The articulated arm 32 includes a horizontal first arm 33, a horizontal second arm 34, and a support 35. The base end portion of the first arm 33 is provided on the lifting mechanism 31 to be rotatable around the vertical axis, and the base end portion of the second arm 34 is provided on the tip end portion of the first arm 33 to be rotatable around the vertical axis.

The lifting mechanism 31, the first arm 33, and the second arm 34 are configured as a moving mechanism 30 that moves the support 35 to arbitrary positions in the lateral direction and the height direction. In order to receive a wafer W in the module or the transport container C and support the wafer W from below, the support 35 moves laterally toward the lower side of the wafer W. In the following description, the traveling direction of the support 35 will be described as forward. In the description, FIG. 3 which is a side view of the support 35, is also referred to.

The support 35 is a horizontal plate-shaped member, and the rear portion (the base end portion) of the support 35 is provided on the tip end portion of the second arm 34 to be rotatable around the vertical axis. The left and right sides of the front portion (the tip end portion) of the support 35 extend forward, respectively, to form front protrusions 36. Therefore, the support 35 is formed in the shape of a two-pronged fork. Pads 41 are provided on the tip ends of the front protrusions 36, respectively, and the top surfaces on the rear sides of the pads 41 form placement surfaces 42 of the wafer W. In the pads 41, the front sides of the placement surfaces 42 are raised and configured as claw portions 43. A recess is provided on the bottom surface of the front end of each front protrusion 36, and an ultrasonic sensor 4 is embedded in the recess.

Figure 3:
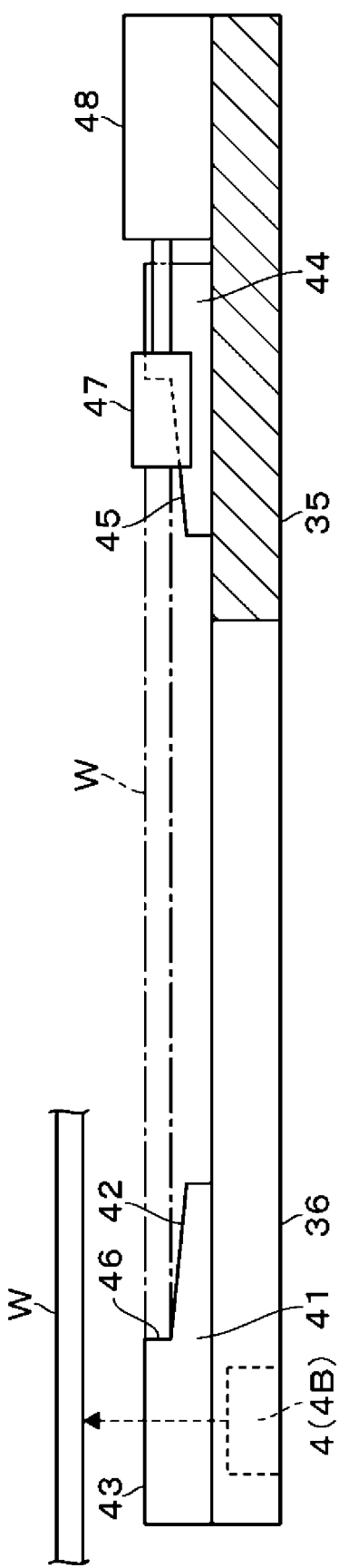
FIG. 3 is a side view of a support of a transport arm, which is an embodiment of the substrate transport apparatus.

Each ultrasonic sensor 4 emits ultrasonic waves in the vertical direction toward the upper side of the claw portion 43 through a through hole (not illustrated) formed in the claw portion 43 in the vertical direction. In FIG. 3, the ultrasonic waves are indicated by a dotted arrow. When the ultrasonic waves collide with a solid detection object positioned on the claw portion 43 and reflected waves are generated, the ultrasonic sensors 4 receive the reflected waves and transmits distance data between the ultrasonic sensors 4 and the above-mentioned detection object to a controller 100 to be described later. As a result, the controller 100 is able to acquire the distance. When viewed from the rear side to the front side, the ultrasonic sensors 4 on the left and right sides may be referred to as 4A and 4B, respectively. 4A is a first ultrasonic sensor, and 4B is a second ultrasonic sensor. These ultrasonic sensors 4A and 4B are provided at the same height as each other.

Pads 44 are provided on the left and right of the rear side of the support 35, and the top surfaces of the pads 44 are formed as placement surfaces 45 of the wafer W. The peripheral edge portion of a wafer W is placed on the placement surfaces 42 and 45 of the pads 41 and 44, and the wafer W is horizontally supported by the support 35. The side surfaces of the claw portions 43 on the rear side form facing surfaces 46 facing the side surface of the wafer W supported as described above.

In the rear portion of the support 35, two rollers 47 that are rotatable around a vertical axis and a roller moving mechanism 48 that moves each roller 47 back and forth are provided. The rollers 47 are provided to be spaced apart from each other on the left and right sides and are configured to be rotatable around a vertical axis, and the side surfaces of respective rollers 47 face the side surface of the wafer W placed on the placement surfaces 42 and 45. During the transport of the wafer W by the transport mechanism 3, the rollers 47 press the side surface of the wafer W on the rear side toward the front side, whereby the side surface of the wafer W on the front side comes into contact with the facing surfaces 46. Therefore, as illustrated by the chain lines in FIG. 3, the wafer W is gripped by the rollers 47 which are the pressers and the claw portions 43 which are the facing portions, and the position of the wafer W on the support 35 is fixed. As a result, the position of the wafer W on the support 35 during the transport is prevented from being displaced, and the wafer W is transported to an appropriate position of a transport destination.

The moving mechanism 30 (the lifting mechanism 31, first arm 33, and second arm 34) and the support 35 may be described as a transport apparatus main body 39. As described above, the ultrasonic sensors 4 are provided on the transport apparatus main body 39. As will be described later, the transport apparatus main body 39 is an object for abnormality detection using the ultrasonic sensors 4. Therefore, when the transport apparatus main body 39 is described as it is, the ultrasonic sensors 4 are not included therein. Therefore, the transport apparatus main body 39 is a constituent member excluding the ultrasonic sensors 4 from the transport mechanism 3. The reason for providing the ultrasonic sensors 4 is described. A wafer W stored in a transport container C and transported to the substrate processing apparatus 1 may be warped. Depending on this warped state, an abnormal process may be performed in the processing module 7. As a specific example, it is assumed that the wafer W is warped so that the central portion is positioned above the peripheral edge portion, that is, the wafer W has an inverted bowl shape, and the warpage is relatively large. In that case, when the wafer W is transported to the processing module 7, the central portion of the wafer W may not be adsorbed on the stage of the processing module 7. When not adsorbed in this way, a processing gas flows around from the front surface to the rear surface of the wafer W, causing an abnormality in which an unnecessary film is formed on the rear surface. In addition, the processing module 7 may be configured as a module for performing a process by forming plasma on the surface of the wafer W. In that case, when the wafer W is not adsorbed on the stage, a discharge may occur between the stage and the rear surface of the wafer W, and the rear surface of the wafer W may be damaged.

Figure 4:
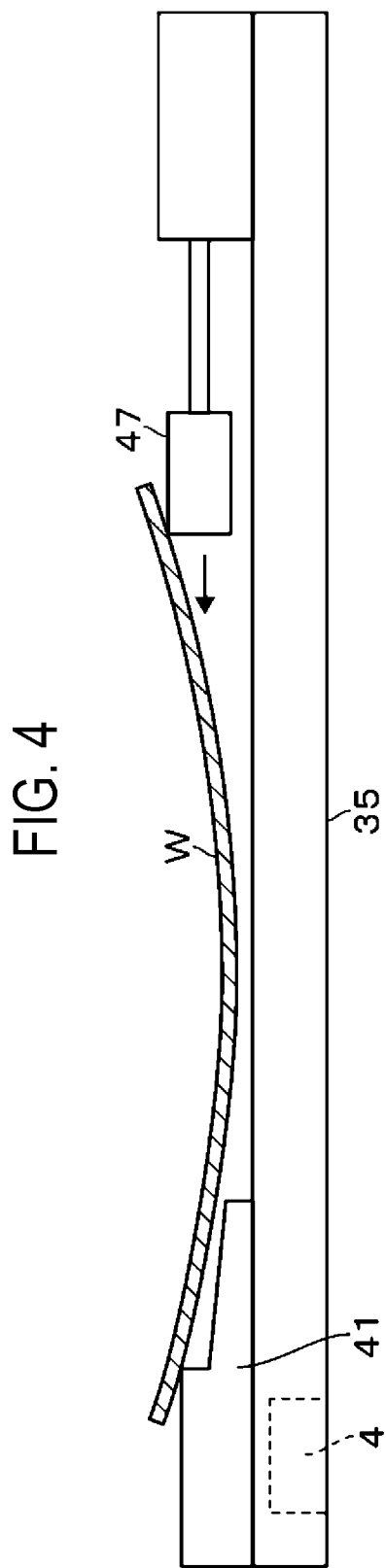
FIG. 4 is a side view of the support.

In addition, it is conceivable that the wafer W may be warped or the warpage may be increased due to the process in the processing module 7. Therefore, even if transport from the transport container C to the load-lock module 5A can be performed normally, it is conceivable that an abnormality occurs when the wafer W is transported from the load-lock module 5B to the transport container C. An example of an abnormality generated by the warpage of the wafer W in the load-lock module 5B will be described with reference to FIG. 4. The wafer W illustrated in FIG. 4 is warped such that the peripheral edge portion is positioned above the central portion, that is, the wafer W has a bowl shape, and the warpage is relatively large. In that case, after the support 35 receives the wafer W, when the rollers 47 move forward to fix the wafer W, the rollers 47 are crawled into the rear surface of the wafer W. Then, the rollers 47 may repel the wafer W from above the support 35, and the wafer W may fall to the floor of the load-lock module 5B and crack.

The case in which a wafer W of a transport container C is warped in an inverted bowl shape and the case in which a wafer W in the load-lock module 5B is warped in a bowl shape have been described as examples. However, even if the wafer W does not have the shape, when the warpage is large, the support 35 may not be able to receive the wafer W, or the wafer W may be transported to an inappropriate position at the transport destination. In order to prevent the occurrence of the above-described abnormalities in transporting and processing a wafer W, the ultrasonic sensors 4 is provided on the support 35 in the substrate processing apparatus 1, and the rear surface of the wafer W is scanned by the support 35 from the lower side of the wafer W to inspect the warped state (=a height distribution) of the wafer W. Then, the transport of the wafer W determined to be abnormal as a result of inspection is stopped so as to prevent the occurrence of the above-mentioned problem in transporting the wafer W or to prevent the wafer W from being inappropriately processed.

As described above, the ultrasonic sensors 4 emits ultrasonic waves to the rear surface of the wafer W. The reason for emitting ultrasonic waves to the rear surface in this way is to raise the support 35 to quickly receive the wafer W when there is no abnormality in the warped state of the wafer W. More specifically, a configuration is assumed in which ultrasonic sensors 4 are provided to emit ultrasonic waves downward to the support 35, and the front surface (the top surface) of the wafer W is scanned from above the wafer W to inspect the warped state. In that case, after scanning, the support 35 is retracted from above the wafer W, further positioned below the wafer W, and then raised to receive the wafer W. Therefore, the movement amount of the support 35 until receiving the wafer W becomes relatively large. By adopting the configuration in which ultrasonic waves are emitted to the rear surface of the wafer W as described above with reference to FIG. 3, the increase in the movement amount required for receiving the wafer W is prevented, and the decrease in the throughput of the apparatus is suppressed.

As a sensor for detecting a distance to a detection object, an optical sensor that detects the distance by emitting light to the detection object and receiving the reflected light from the detection object is known. However, the rear surface of a wafer W is various and may be a mirror surface or may be subjected to film formation. When an optical sensor is used, the orientation of the reflected light is easily affected by the state of the rear surface of the wafer W. Thus, depending on the state of the rear surface, it may be required to provide a light emitter and a light receiver constituting the sensor at separate positions, respectively, which may take time and effort in setting the layout of the sensor. In addition, when the light emitter and the light receiver are greatly separated from each other, the sensor may be enlarged, which may make it difficult to lay out the sensor on the support 35. However, the detection by the ultrasonic sensors 4 is not easily affected by the state of the rear surface of a wafer W. Therefore, the ultrasonic sensors 4 have an advantage that the enlargement thereof is prevented and that the layout setting thereof on the support 35 is easy.

It is also conceivable that the transport abnormality of a wafer W is not limited to being caused by the warp of the wafer W, but may be caused by the abnormality of the transport mechanism 3. The substrate processing apparatus 1 is configured such that the abnormality inspection of the transport mechanism 3 is performed by performing, by the ultrasonic sensors 4, the acquisition of, for example, the distance to a determination member 81 (see FIG. 1) provided in a transport region 29 of the loader module 2. Accordingly, in addition to the wafer W, the determination member 81 corresponds to a detection object of the ultrasonic sensors 4 in the substrate processing apparatus 1. The details of the determination member 81 will be described later together with the description of the abnormality inspection of the transport mechanism 3.

In receiving each of the wafers W from the slots 1 to 25 of the transport container C and the load-lock modules 5A and 5B, the support 35 advances toward the wafer W, which is a receiving object, as described above, thereby moving to a set position (referred to as a receiving position) below the wafer W. Then, the support 35 rises a predetermined amount from this receiving position and receives the wafer W by scooping it up, so that the wafer W is placed on the placement surfaces 42 and 45, as described above. For the receiving position, the following is supplemented: information corresponding to each of the position in the X direction, the position in the Y direction, and the position in the height direction is preset, and the information corresponding to the position in each of these directions is stored in the controller 100. The controller 100 operates the moving mechanism 30 according to the information, and positions the support 35 at the receiving position. In the substrate processing apparatus 1, this information is updated by detecting a wafer W by using the ultrasonic sensors 4. That is, the substrate processing apparatus 1 is configured such that an operation is taught to the transport mechanism 3, that is, so-called teaching is performed.

FIG. 1 illustrates the controller 100. The controller 100 is configured with a computer, and constitutes a transport determinator configured to determine whether or not to perform transport based on a distance acquired from each ultrasonic sensor 4 and an abnormality determinator configured to determine whether or not the transport apparatus main body 39 is abnormal. The controller 100 includes a program. In order to perform the above-described transport and processing of the wafer W, and each operation to be described later, this program includes a group of steps set such that control signals can be output to each part of the substrate processing apparatus 1 to control the operation of each part. In addition, various calculations, determinations, and decisions to be described later are executed by the program. The controller 100 is configured to be able to grasp the position of the support 35 by using, for example, the encoder output of a motor incorporated in the transport mechanism 3 in order to perform the calculations, determinations, and decisions. The above-mentioned program is stored in the controller 100 in a state of being stored in a storage medium such as a hard disk, a compact disk, a DVD, or a memory card.

The controller 100 includes a memory 101. The receiving position information described above is stored in the memory 101, and the information is appropriately updated by teaching. Therefore, the controller 100 constitutes an updater configured to update the information in the memory 101. In addition, data for determining an abnormality of the transport mechanism 3 using the determination member 81 is also stored in the memory 101. Further, the controller 100 includes an alarm output unit. This alarm output unit is a screen or a speaker, and when an inspection result of a warped state to be described later is determined to be abnormal or when an inspection result of the transport mechanism 3 is determined to be abnormal, the alarm output unit outputs an alarm as a screen display or voice.

[First Inspection Method for Warped State of Wafer W]

The substrate processing apparatus 1 is capable of inspecting the warped state (=height distribution) of a wafer W in other aspects. The first inspection method, which is one of the aspects, will be described by taking the case in which a wafer W is transported from slot 1 of the transport container C as an example and with reference to the schematic side view of FIG. 5 and the schematic plan views of FIGS. 6 to 11. When the wafer W is transported from the transport container C in this way, a support 14 of the transport container C corresponds to a first placement portion, and the alignment module 20 and the load-lock module 5A, which are the transport destinations of the wafer W, correspond to a second placement portion.

Figure 5:
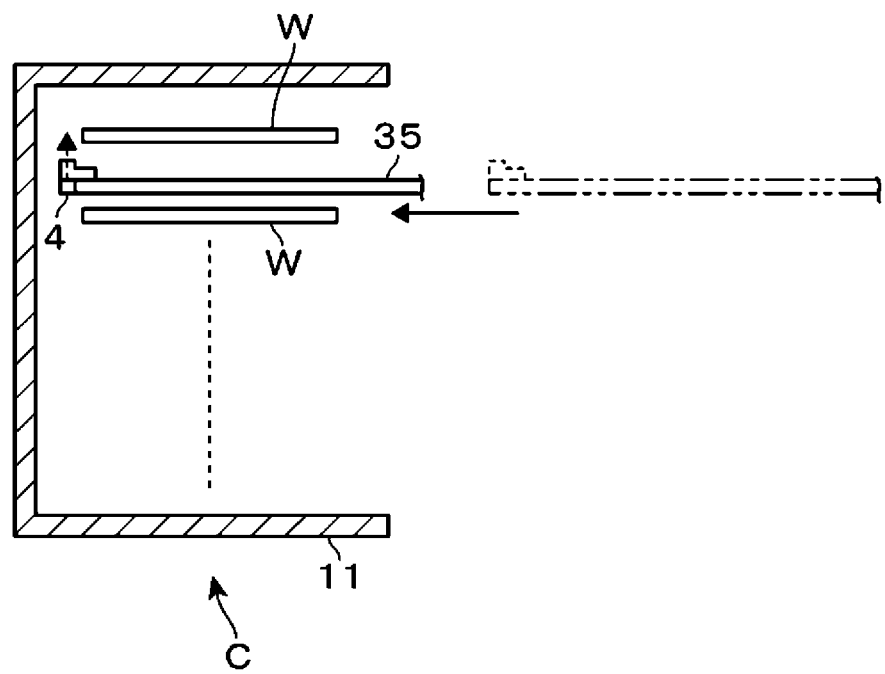
FIG. 5 is a side view of the support and a transport container.
Figure 6:
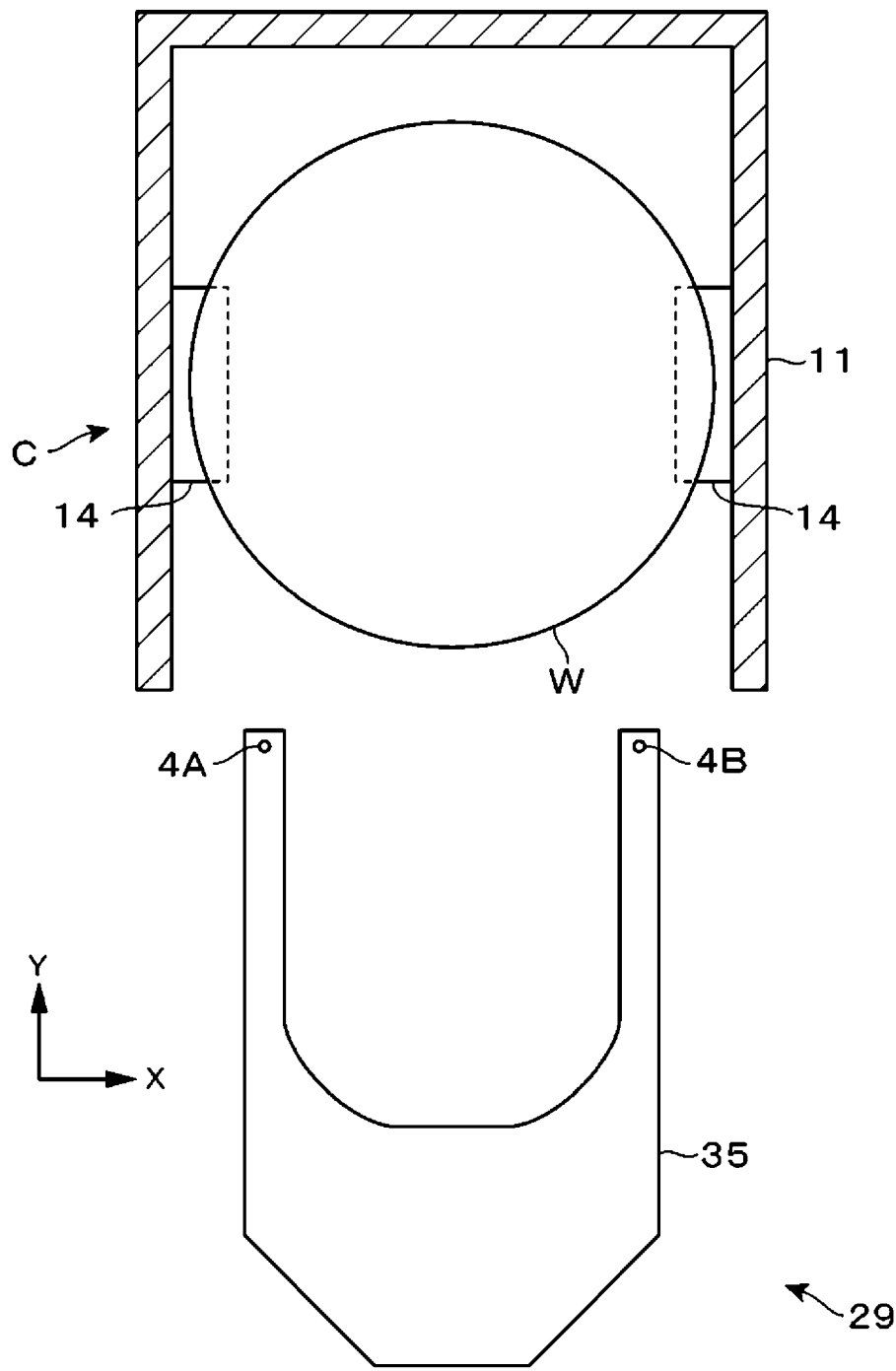
FIG. 6 is an explanatory view illustrating an operation process of the transport arm.
Figure 7:
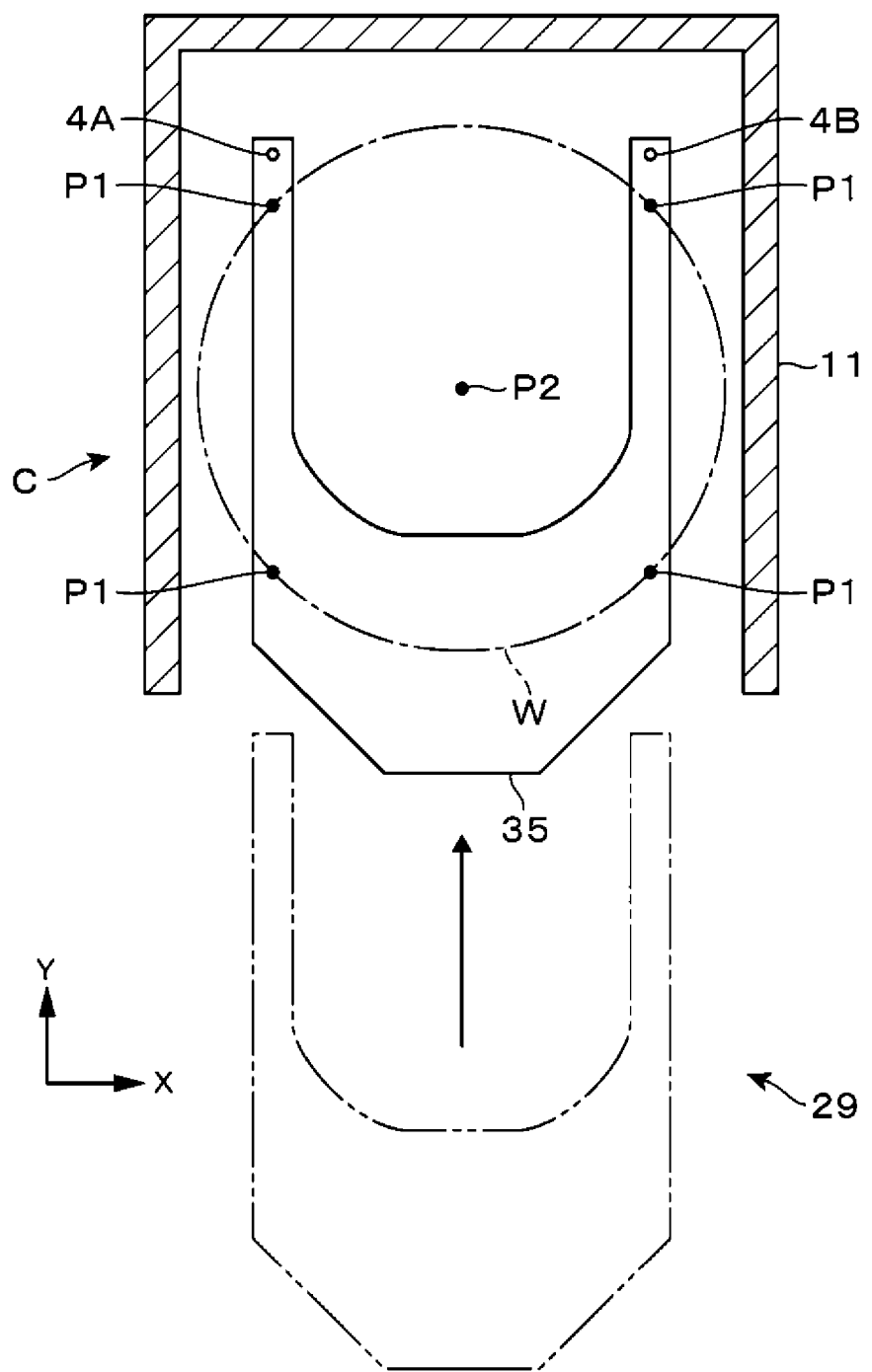
FIG. 7 is an explanatory view illustrating an operation process of the transport arm.
Figure 8:
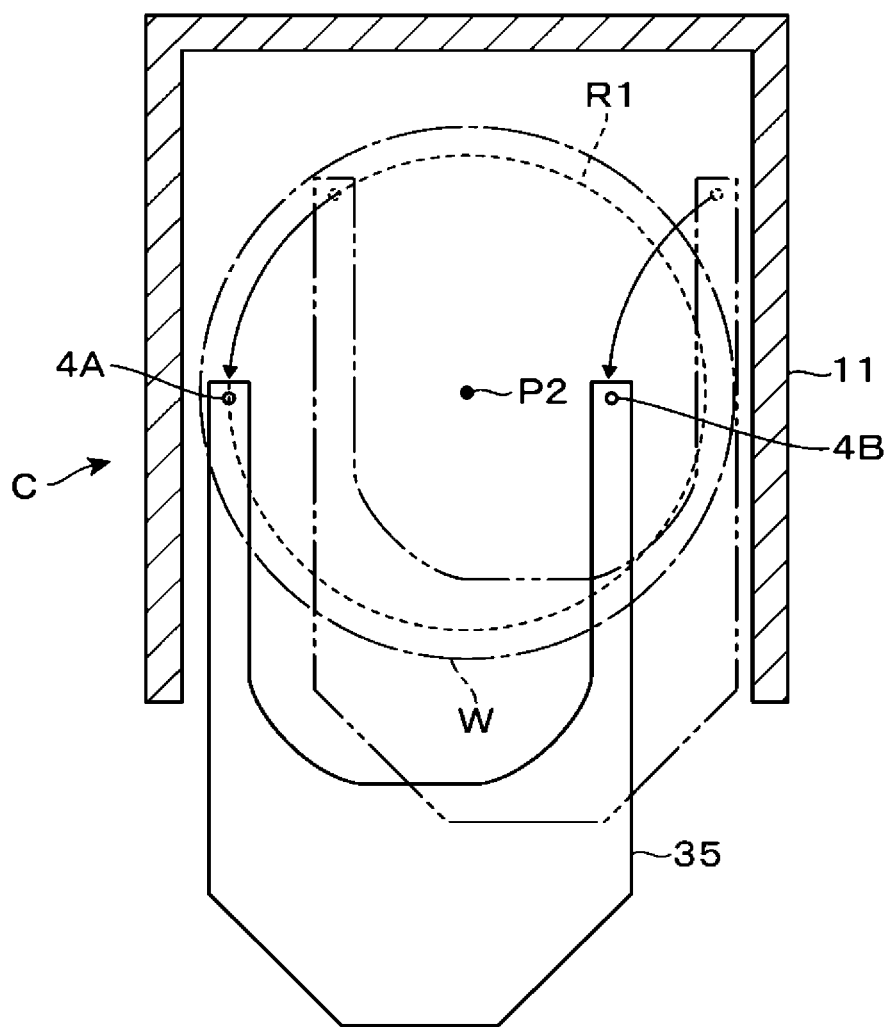
FIG. 8 is an explanatory view illustrating an operation process of the transport arm.
Figure 9:
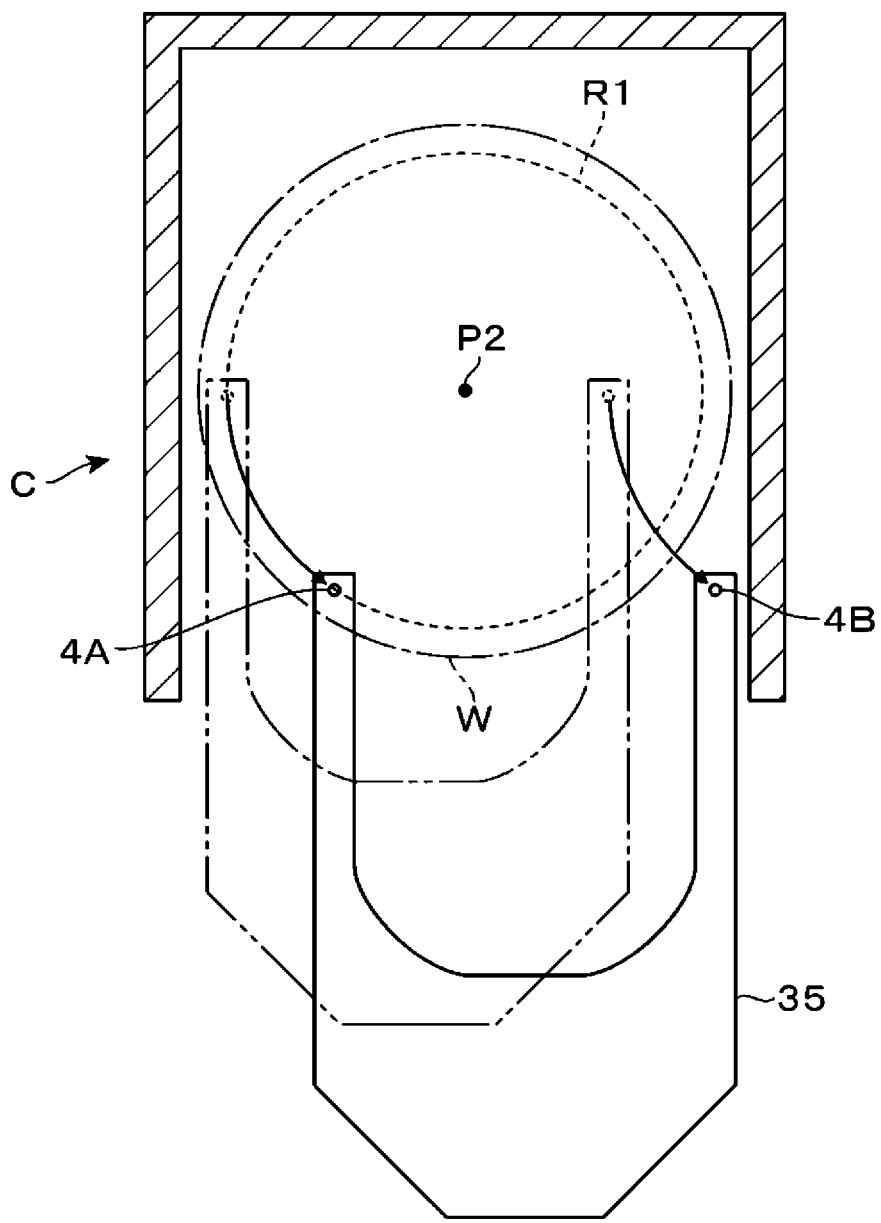
FIG. 9 is an explanatory view illustrating an operation process of the transport arm.
Figure 10:
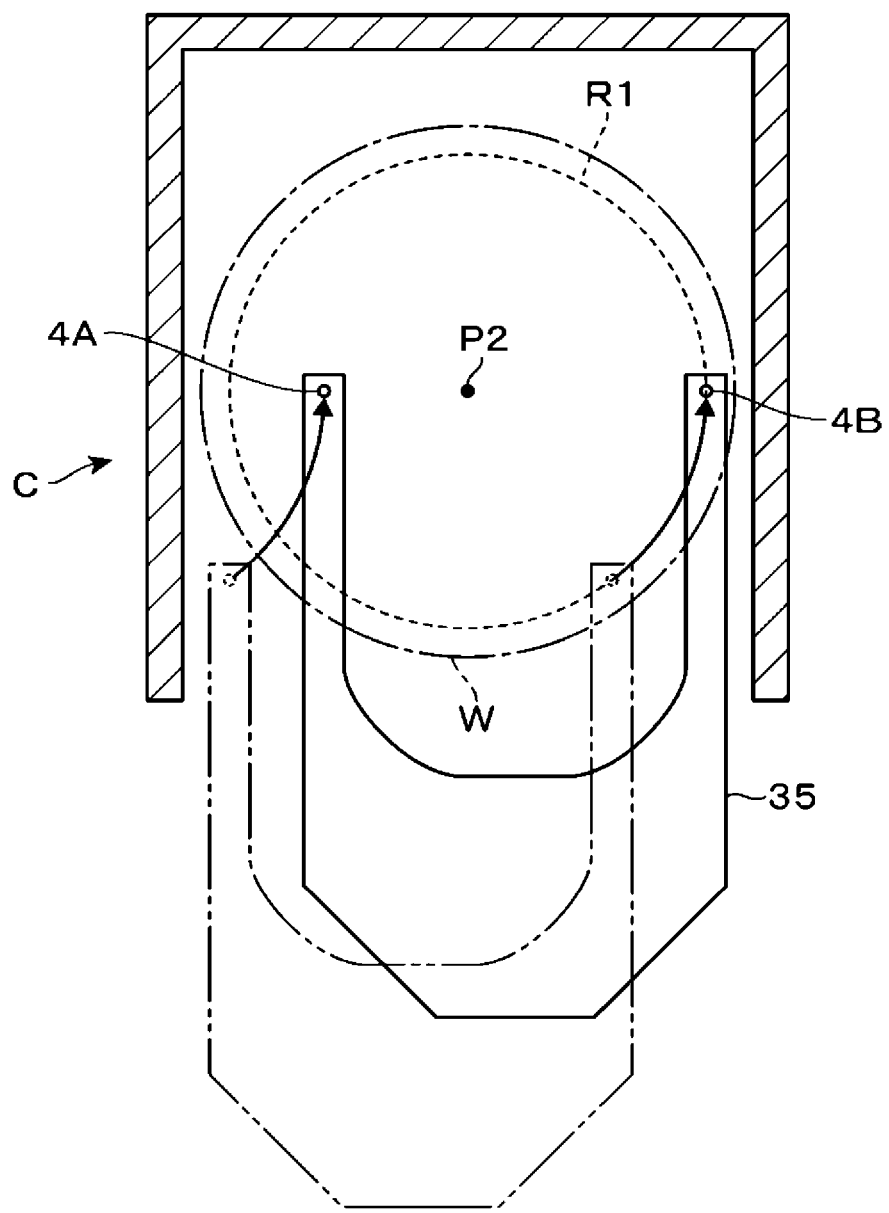
FIG. 10 is an explanatory view illustrating an operation process of the transport arm.
Figure 11:
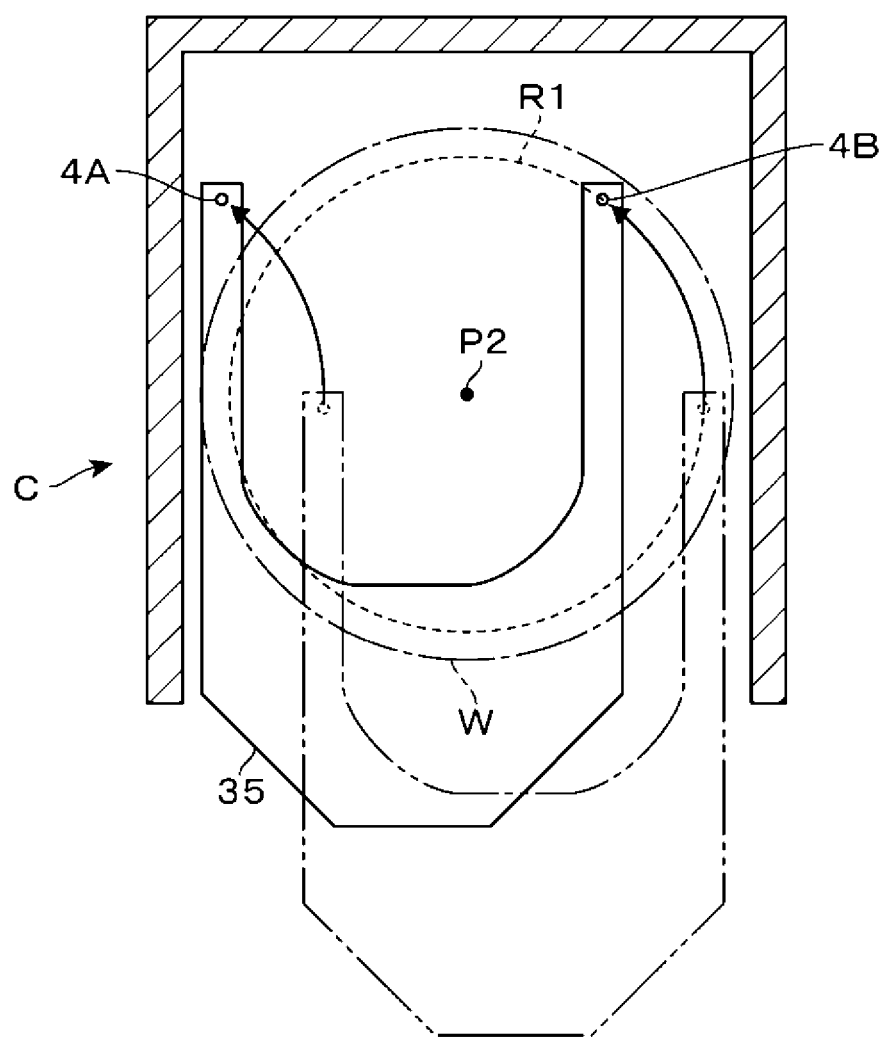
FIG. 11 is an explanatory view illustrating an operation process of the transport arm.

First, in the transport region 29 of the loader module 2, the front side of the support 35 of the transport mechanism 3 faces the transport container C and moves to the height of the receiving position of the wafer W in slot 1 (FIG. 6). Subsequently, ultrasonic waves are emitted from each ultrasonic sensor 4 to start acquisition of distance data, the support 35 advances, and as illustrated in FIG. 5, the ultrasonic sensors 4 enter the container main body 11 of the transport container C. In accordance with the movement of the support 35, ultrasonic waves are emitted to the peripheral end on the rear side of the wafer W, and the position to which the ultrasonic waves are emitted moves toward the front side on the rear surface of the wafer W. Therefore, the support 35 moves from the transport region 29 outside the wafer W to a position below the wafer W that overlaps the wafer W in a plan view. Then, the support 35 moves to the peripheral end on the front side of the wafer W with respect to the position to which the ultrasonic waves are emitted, and the support 35 is further moved to be out of the wafer W. Then, as illustrated by the solid line in FIG. 7, for example, when the support 35 is positioned at the receiving position, the advance of the support 35 is stopped and the radiation of ultrasonic waves from the ultrasonic sensors 4 is stopped (step S1).

Based on the distance data acquired from each ultrasonic sensor 4 in step S1, the positions of four points P1, which are the peripheral ends of the wafer W in the plan view, are detected in the X direction and the Y direction. Further describing this detection, as described above, in step S1 (first step), the ultrasonic sensors 4 (4A, 4B) are moved such that the positions to which the ultrasonic waves are emitted span the wafer W back and forth. When the distance from the ultrasonic sensors 4 to a detection object is relatively long, distance data cannot be acquired. Therefore, in step S1 above, the distance data of an object other than the wafer W in the container main body 11, such as the inner wall of the container main body 11, is not acquired, and only the distance data for the wafer W is acquired. In addition, since the controller 100 is able to grasp the position of the support 35 as described above, it is possible to specify the positions of the points P1 from the distance data acquired in step S1 as described above. Then, from the acquired four points P1, the positions in the X direction and the Y direction with respect to a point P2 which is the center of the circle passing through all the four points P1 are calculated. That is, the point P2, which is the position of the center of the wafer W, is estimated based on the positions of the points P1.

Subsequently, the support 35 moves such that the ultrasonic sensor 4A is separated from the point P2 by a predetermined amount on the front side and a predetermined amount on the left side in a plan view. The support 35 moved in this way is illustrated by the alternate long and two short dashes line in FIG. 8, in which the ultrasonic sensor 4A is positioned to overlap the wafer W in a plan view. Subsequently, ultrasonic waves are emitted from the ultrasonic sensors 4A and 4B. Then, the support 35 moves rearward while maintaining the orientation thereof, for example, forward such that the ultrasonic sensor 4A moves counterclockwise along a circle R1 centered on the point P2 in a plan view. The support 35 moving in this way is illustrated by the solid line in FIG. 8 and the alternate long and two short dashes line in FIG. 9, respectively. Due to the movement of the support 35, ultrasonic waves are emitted from the ultrasonic sensors 4A and 4B to the peripheral edge portion and the central portion of the wafer W, respectively. When the ultrasonic sensor 4A moves a predetermined amount to the rear side and a predetermined amount to the left side with respect to the point P2 in a plan view, the radiation of ultrasonic waves from the ultrasonic sensors 4A and 4B is stopped (step S2). The support 35 in the state of being moved to such a position is illustrated by the solid line in FIG. 9.

Thereafter, the support 35 moves such that the ultrasonic sensor 4B is separated from the point P2 by a predetermined amount to the rear side and a predetermined amount to the right side in a plan view. The support 35 moved in this way is illustrated by the alternate long and two short dashes line in FIG. 10, and the ultrasonic sensor 4B is positioned to overlap the wafer W in a plan view. Subsequently, ultrasonic waves are emitted from the ultrasonic sensors 4A and 4B. Then, the support 35 moves forward while maintaining the orientation thereof, for example, forward such that the ultrasonic sensor 4B moves clockwise along the circle R1 in a plan view. The support 35 moving in this way is illustrated by the solid line in FIG. 10 and the alternate long and two short dashes line in FIG. 11, respectively. Due to the movement of the support 35, ultrasonic waves are emitted from the ultrasonic sensors 4B and 4A to the peripheral edge portion and the central portion of the wafer W, respectively. When the ultrasonic sensor 4B moves a predetermined amount to the front side and a predetermined amount to the right side with respect to the point P2 in a plan view, the radiation of ultrasonic waves from the ultrasonic sensors 4A and 4B is stopped (step S3). The support 35 in the state of being moved to such a position is illustrated by the solid line in FIG. 11.

The circle R1 is a circle slightly smaller than the circle passing through the four points P1 centered on the point P2, and is set to an appropriate size such that ultrasonic waves are emitted to the peripheral edge portion of the wafer W even when the wafer W is not a regular circle in a plan view due to warpage. The height of the support 35 during the execution of steps S1 to S3 is constant.

Figure 12:
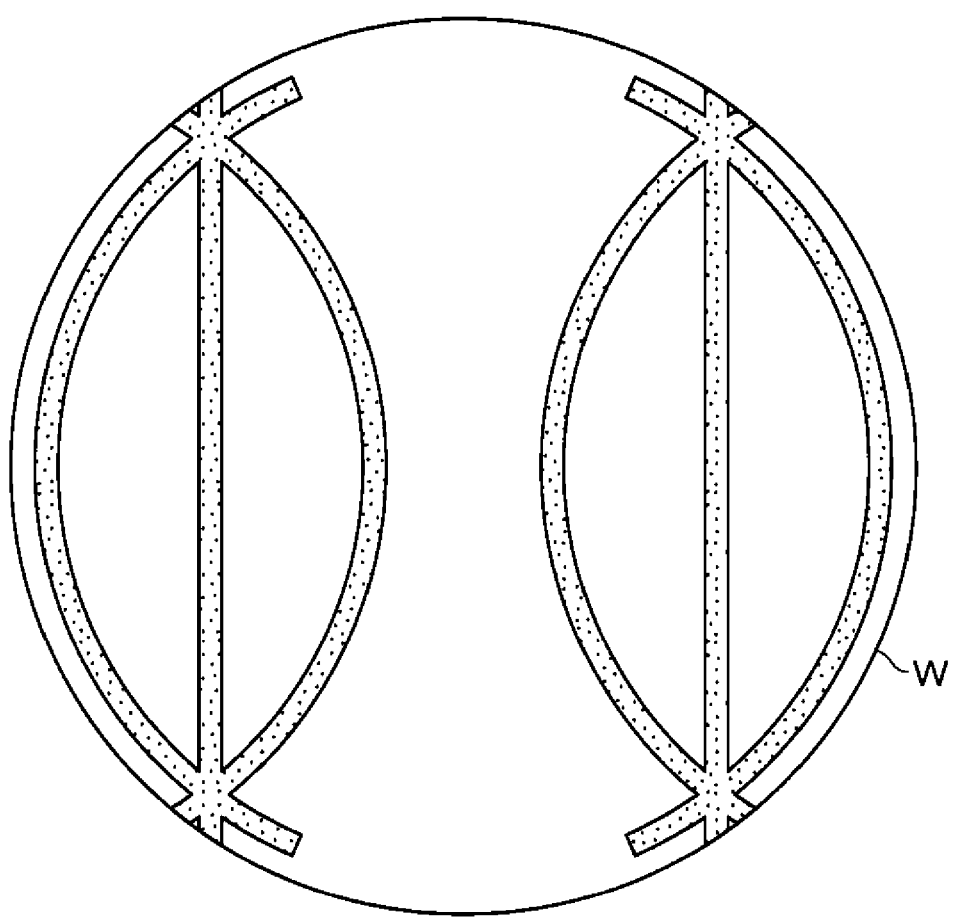
FIG. 12 is a bottom view of a wafer W in which regions to which ultrasonic waves were emitted are illustrated.

FIG. 12 illustrates the rear surface of a wafer W in which regions to which ultrasonic waves were emitted in steps S1 to S3 to acquire distance data are indicated by adding dots. On the rear surface of the wafer W, the height distribution (=warped state) of the regions to which dots are added is acquired. An abnormality is determined based on the warped state acquired in this way (step S4).

Any method and standard may be provided and performed for this abnormality determination. For example, the heights of plural preset points in the central portion in the plane of the wafer W are compared with the heights of plural preset points in the peripheral edge portion, and when there is a difference exceeding an allowable range, it may be determined that there is an abnormality. As described above, when the inverted bowl-shaped warpage of the wafer W is large, a processing abnormality occurs in the processing module 7. Therefore, for example, when the distance acquired at a preset position on the center side of the wafer W minus the distance acquired at a preset position on the peripheral edge side of the wafer W exceeds the allowable range, it is determined to be abnormal.

Even for a location where distance data is not acquired within the plane of the wafer W, by allowing the distance to be estimated by a predetermined algorithm from the distance of the location where the surrounding measurement has been performed, for example, the entire in-plane height distribution of the wafer W may be acquired, and thus abnormality determination in step S4 may be performed. Therefore, the distance used for abnormality determination is not limited to the distance of a region acquired by directly emitting ultrasonic waves. As described above, the left and right peripheral edges of the wafer W are supported by the support 14 of the container main body 11. Even if a portion of a region to which ultrasonic waves are emitted overlaps the support 14 that supports the wafer W, it is possible to identify the support 14 from the difference in distance from the wafer W with respect to the ultrasonic sensors 4. Therefore, abnormality determination is performed excluding, for example, the distance data acquired from the support 14. In addition, the distance data acquired in step S1 may be used only for the detection of the above-mentioned points P1 and P2, and the determination in step S4 may be performed by using only the distance data acquired in steps S2 and S3.

When the determination result in step S4 is normal, the support 35 is returned to the receiving position from the position where the radiation of ultrasonic waves from the ultrasonic sensors 4 is stopped in the above-described step S3, and the support 35 receives the wafer W by being raised from that location and transports the wafer W to the alignment module 20. When the determination result is abnormal, it is determined that the wafer W in slot 1 is not transported, and the support 35 retracts from the container main body 11 without receiving the wafer W and returns to the transport region 29 of the loader module 2.

In this inspection method, due to the movement of the support 35 in step S2 described above, the ultrasonic sensor 4A disposed on the left side of the support 35 moves along the left arc (first arc) forming the circle R1 in a plan view. Then, due to the movement of the support 35 in step S3, the ultrasonic sensor 4B disposed on the right side of the support 35 moves along the right arc (second arc) forming the circle R1 in a plan view. Therefore, the locus of the arc of the ultrasonic sensor 4A in step S2 and the locus of the arc of the ultrasonic sensor 4B in step S3 are different from each other. By scanning different portions of the peripheral edge portion of the wafer W with separate ultrasonic sensors 4, respectively, as described above, distance data is acquired in a wide range of the peripheral edge portion of the wafer W in the state in which the movement of the support 35 is restricted in the container main body 11. In addition, by using an ultrasonic sensor 4 different from the ultrasonic sensors 4 used for scanning the peripheral edge portion of the wafer W as described above, a position closer to the center of the wafer W than the peripheral edge portion is also scanned, so that a wide region is rapidly scanned. Therefore, in the present method, since it becomes possible to use distance data over a wide range while suppressing a decrease in throughput of the apparatus, the inspection is conducted to improve accuracy. Although it has been described that, of steps S2 and S3, step S2 is performed first, but step S3 may be performed first. Of steps S2 and S3, the step performed first is the second step, and the step performed later is the third step.

[Second Inspection Method for Warped State of Wafer W]

Figure 13:
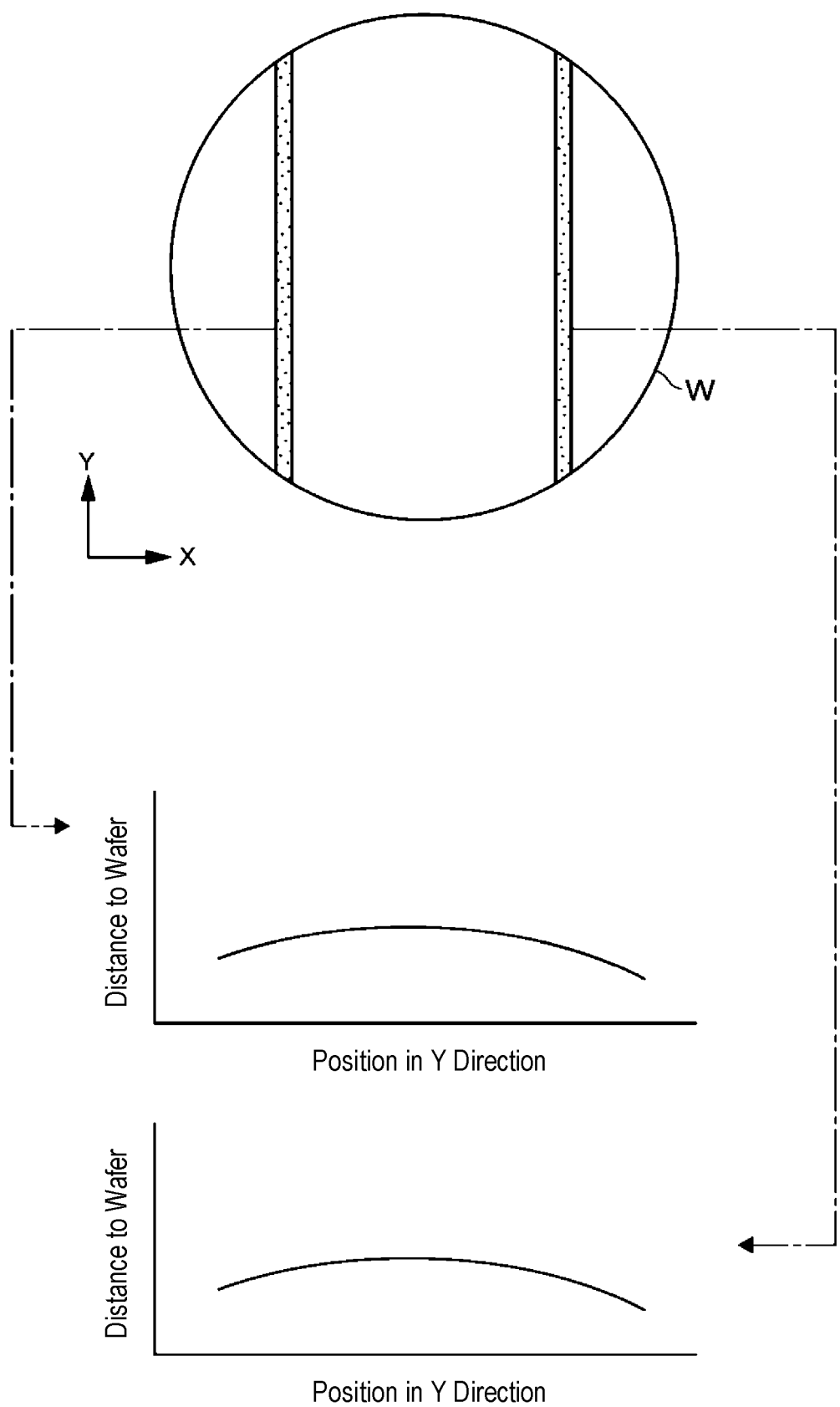
FIG. 13 is a bottom view of a wafer W in which regions to which ultrasonic waves were emitted are illustrated.

Subsequently, a second inspection method for the warped state of a wafer W will be described by taking as an example the case in which a wafer W is transported from slot 1 of the transfer container C as in the first inspection method. In this second inspection method, only the operation of step S1 is conducted among the operations of the support 35 described as steps S1 to S3 in the first inspection method. Therefore, as described above with reference to FIGS. 5 to 7, the support 35 is introduced into the container main body 11, and distance data for a linear region from the front end to the rear end of the wafer W is acquired by the ultrasonic sensors 4A and 4B. On the upper side of FIG. 13, as in FIG. 12, dots are added to the regions to which ultrasonic waves are emitted in the plane of a wafer W. In the lower side of FIG. 13, the correspondence between a distance acquired from each of the two linear regions to be scanned and a position where the distance is acquired (that is, the height distribution of the wafer W) is illustrated as a graph. The illustrated graphs are obtained when the wafer W is warped in an inverted bowl shape.

The presence or absence of an abnormality is determined based on the distance acquired in step S1 above (step S5). When there is no abnormality, the support 35 located at the receiving position by executing step S1 receives the wafer W by being raised and transports the wafer W. As for the abnormality determination in step S5, any method and standard may be provided and performed as in the determination in step S4. In order to prevent a processing problem in the processing module 7 described above, for example, the distance acquired at a preset position on the center side minus the distance acquired at a preset position on the peripheral edge side exceeds an allowable range, it is determined to be abnormal. When it is determined in the determination in step S5 that there is an abnormal, the support 35 retracts from the interior of the container main body 11 without transporting the wafer W in slot 1, as in the case in which it is determined in step S4 of the first inspection method that there is an abnormality.

[Third Inspection Method for Warped State of Wafer W]

Although it has been described that either the first inspection method or the second inspection method is performed, a third inspection method that combines these inspection methods may be performed. First, steps S1 and S5 described as the second inspection method are executed for the wafer W in slot 1. When it is determined in step S5 that there is no abnormality, the wafer W is transported. Meanwhile, even when it is determined in step S5 that there is an abnormality, the decision not to transport the wafer W is suspended, and steps S2 to S4 described in the first inspection method are executed. When it is determined in step S4 that there is no abnormality, the wafer W is transported, and when it is determined in step S4 that there is an abnormality, the wafer W is not transported.

Briefly describing this third inspection method, by using the distance data obtained when the support 35 performs the operation for receiving the wafer W (the operation in step S1), as step S5, it is determined whether or not there is a possibility of an abnormality in the warped state. Then, it is determined whether or not to perform steps S2 and S3 based on the distance acquired in this step S1. That is, steps S2 and S3 are executed only when there is a possibility of an abnormality to acquire distance data from a wide range in the plane of the wafer W, it is determined whether or not there is an abnormality based on the distance data (step S4), and it is determined whether or not to transport the wafer W. Therefore, in this third inspection method, while performing abnormality determination for a warped state with high accuracy, it is possible to suppress the movement of the support 35 for performing this determination and to more reliably suppress the decrease in the throughput of the apparatus.

Figure 14:
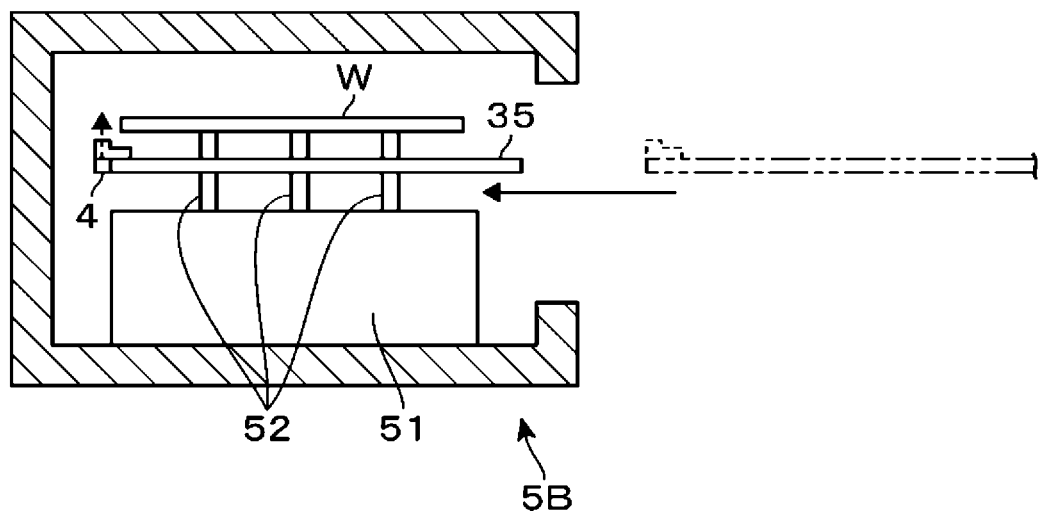
FIG. 14 is a side view illustrating the support and a load-lock module constituting the apparatus.

In describing the first to third inspection methods, the case of transporting the wafer W of slot 1 of the transport container C has been described as a representative, but in the case of transporting the wafer W of another slot and the case of transporting the wafer W of the load-lock module 5B, the operation of the support 35 is performed in the same manner as in the above-described example. As illustrated in FIG. 14, when a wafer W of the load-lock module 5B is inspected, the wafer W is supported on the lifting pins 52 to be in the state of being lifted from the surface of the stage 51, and the operations of the support 35 of steps S1 to S3 are performed. Therefore, when the wafer W is transported from the load-lock module 5B in this way, the lifting pins 52 correspond to a first placement portion, and a support 14 of the transport destination container C corresponds to a second placement portion. Regarding the determination in steps S4 and S5, as described with reference to FIG. 4, when the warpage of the wafer W in a bowl shape becomes large, it may be determined to be abnormal. Therefore, for example, when the distance acquired at a preset position on the peripheral edge side of the wafer W minus the distance acquired at a preset position on the center side of the wafer W exceeds an allowable range, it is determined to be abnormal. Then, as in the case of inspecting the wafer W of the transport container C, the wafer W determined to be abnormal is not transported.

It is assumed that, for example, the first or third inspection method is performed on the wafer W of the load-lock module 5B. In addition, it is assumed that, in step S4, it is determined that there is an abnormality in the warped state of the wafer W, and it is determined not to transport the wafer W. The support 35 may receive the wafer W and transport the wafer W after a preset time has elapsed after the determination in step S4 was performed as described above. Alternatively, after the preset time has elapsed after the determination in step S4, the first or third inspection method may be performed again to determine whether or not to transport the wafer W according to the determination in step S4.

The transport after the lapse of such a set time or the transport according to the result of re-inspection is performed because there is a case in which the warpage of the wafer W immediately after being carried into the load-lock module 5B is relatively large due to the heat treatment in the processing module 7, but the warpage is alleviated due to heat dissipation. By allowing the transport after the lapse of such a set time or the transport according to the re-inspection to be performed, it is possible to improve the operating efficiency of the apparatus by preventing the occurrence of an unnecessary work in which a worker collects the wafer W of the load-lock module 5B that is originally transportable by the transport mechanism 3. For convenience, the case in which the first or third inspection method is performed has been described as an example, but the same transport control may be performed when the second inspection method is performed. That is, when it is determined to be abnormal in step S5, the wafer W may be transported or re-inspected after the set time elapses.

[First Abnormality Inspection of Transport Apparatus Main Body 39]

Subsequently, the abnormality inspection of the transport apparatus main body 39 will be described. This inspection includes a first anomaly inspection and a second anomaly inspection. Hereinafter, the first abnormality inspection will be described with reference to FIG. 15. The support 35 constituting the transport mechanism 3 is provided horizontally as illustrated by the chain line in FIG. 15, but an abnormality may occur in which the tip end sags down as illustrated by the solid line in FIG. 15 due to the influence of gravity or the like. As the first abnormality inspection, this sagging abnormality is inspected.

As described above, the determination member 81 of the loader module 2 is used for the inspection. The determination member 81 will be described with reference to FIG. 16, which is a bottom view. The determination member 81 is, for example, a plate-shaped body. The bottom surface of the determination member 81 forms a horizontal surface, and has a linear groove 82 formed therein. On the lower surface, the outside of the groove 82 is a flat portion 83.

In performing the first abnormality inspection, the support 35 is disposed at a first inspection position below the determination member 81. This first inspection position is a position set in advance with respect to each of the X direction, the Y direction, and the height direction, and is set such that ultrasonic waves are emitted from each ultrasonic sensor 4 of the support 35 disposed at the first inspection position to the flat portion 83 of the determination member 81. When the support 35 is horizontal, the distance (reference distance) obtained from each ultrasonic sensor 4 disposed at the first inspection position is stored in the memory 101 of the controller 100.

Figure 15:
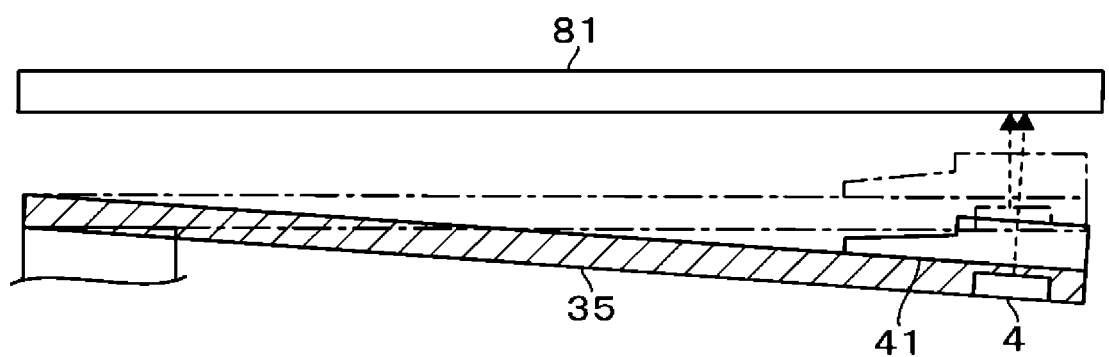
FIG. 15 is a side view of the support.

In the first abnormality inspection, the support 35 is disposed at the first inspection position, and a difference value between the distance acquired by each ultrasonic sensor 4 and the reference distance is acquired. As illustrated in FIG. 15, when the sagging of the support 35 becomes large, the acquired distance between the ultrasonic sensor 4 and the determination member 81 becomes large. Therefore, when the acquired difference value exceeds an allowable value, it is determined to be abnormal assuming that the sagging has occurred.

[Second Abnormality Inspection of Transport Apparatus Main Body 39]

Next, the second abnormality inspection of the transport apparatus main body 39 will be described. In this second abnormality inspection, it is inspected whether or not the support 35 is disposed at and moved to a set position by the moving mechanism 30 constituting the transport apparatus main body 39. Therefore, this inspection is an inspection for confirming whether or not the wafer W is normally transported to the set position of a transport destination.

Figure 16:
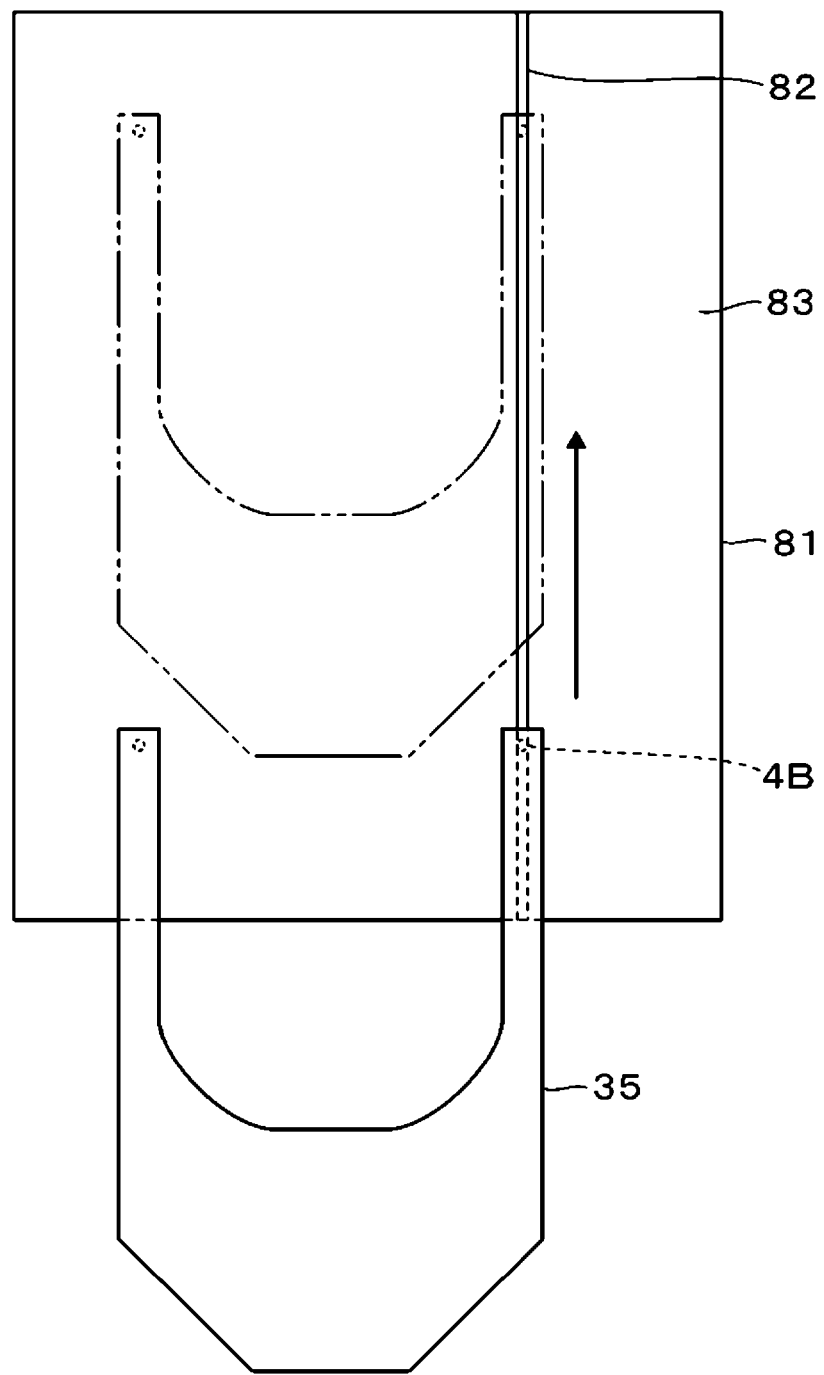
FIG. 16 is a bottom view illustrating the support and an abnormality determining member.

In this second abnormality inspection, the support 35 is horizontally advanced along the groove 82 from a second inspection position to a third inspection position below the determination member 81, and distance acquisition is performed by the ultrasonic sensor 4B during this advancement. Similar to the first inspection position, the second inspection position and the third inspection position are positions set in advance with respect to the X direction, the Y direction, and the height direction, and are set such that ultrasonic waves are emitted to the bottom of the groove 82 is from the ultrasonic sensor 4B. Therefore, the second and third inspection positions are set such that only the distance to the bottom of the groove 82 is acquired and the distance to the flat portion 83 is not acquired during the advancement movement of the support 35. In FIG. 16, the solid line illustrates the support 35 at the second inspection position, and the alternate long and two short dashes line illustrates the support 35 at the third inspection position.

Abnormality determination is performed from a distance acquired during the movement of the support 35 from the second inspection position to the third inspection position as described above. More specifically, for example, this distance acquisition is performed periodically, and the acquired distances are stored in the memory 101. Then, a newly acquired distance is compared with a previously acquired distance in the memory 101, and when the newly acquired distance is smaller than the previously acquired distance, it is determined to be abnormal assuming that the flat portion 83 has been detected and the support 35 is not normally disposed and moved. In addition, when the distance acquired changes while the support 35 is moving, it is determined to be abnormal assuming that the flat portion 83 is detected since the support 35 does not travel straight normally.

The first to third inspection positions of the support 35 described above may be arbitrarily set, and the determination member 81 may be installed according to the positions. Therefore, the determination member 81 is a member that is disposed with a positional relationship determined with respect to the support 35 at an arbitrary position. When the positional relationship between the support 35 and the determination member 81 at the time of inspection is determined, abnormality detection may be performed by measuring a distance by the ultrasonic sensors 4 as described above and comparing the distance with a normal distance acquired in advance. Therefore, the determination member 81 is not limited to the above-mentioned shape, and may have any shape. For example, the determination member may be configured to have a protrusion instead of the groove 82, so that the first and second abnormality inspections of the transport apparatus main body 39 may be performed by measuring the distance from the protrusion or identifying whether or not the protrusion is detected dusting advancement. In addition, the determination member 81 is not limited to being provided in the loader module 2, but may be provided in a region accessible by the support 35, such as the load-lock modules 5A and 5B. Further, the determination member 81 is not limited to being permanently installed in the substrate processing apparatus 1, and may be provided in the substrate processing apparatus 1 only when an inspection is executed.

[Teaching of Transport Mechanism 3]

Subsequently, teaching of the transport mechanism 3 by using the ultrasonic sensors 4 will be described by taking as an example the case in which the receiving position of the wafer W in slot 1 is updated. In the state in which the container main body 11 of the transport container C storing a wafer W is placed on the stage 23 of the loader module 2, the support 35 is positioned behind the receiving position of slot 1 in the transport region 29. As the wafer W stored in the container main body 11, a wafer W in a state in which no warpage is present is prepared.

Then, the support 35 is advanced in the state in which ultrasonic waves are emitted from each ultrasonic sensor 4, and is continuously advanced until the four points P1 at the peripheral ends of the wafer W described in the method for inspecting the warped state of a wafer W are detected. Then, as described with reference to FIG. 7, the position of the point P2 at the center of the wafer W in the X and Y directions is calculated from the positions of the points P1 in the X and Y directions. Since the controller 100 is able to grasp the position of the support 35 as described above, the positional relationship between the support 35 and the wafer W is grasped by detecting each point of the wafer W in this way.

The receiving position is corrected in the X direction and the Y direction such that ultrasonic sensors 4A and 4B are equidistant to the left and right with respect to the point P2 calculated as described above and to be spaced apart from the point P2 by a predetermined distance to the front side. In addition, when the distance between the support 35 and the wafer W acquired during the advancement of the support 35 deviates from the set distance, the receiving position is also corrected in the height direction so that the deviation is corrected. The correction of the receiving position is performed by updating the data in the memory 101 by the controller 100. As a result, the next time the support 35 receives the wafer W in slot 1, the support 35 moves to the updated receiving position. The operation of the support 35 and the update of the data in the memory 101 are automatically performed by the controller 100.

The receiving positions of the other slots of the transport container C are also updated by the same procedure. In addition, it is also possible to update the receiving position for the load lock module 5B by performing the procedure described above in the state in which a wafer W is supported by the lifting pins 52. As described above, teaching is automatically performed for the substrate processing apparatus 1. Therefore, compared with, for example, the case in which a worker determines the receiving position by manually changing the position of the support 35 while adjusting the distance between the inner wall or a wafer W in the container main body 11 or the load-lock module 5B and the support 35, the labor is reduced and the working time is shortened.

As described above, in the substrate processing apparatus 1, it is possible to detect the warped state of a wafer W by acquiring the distance to the wafer W by using the ultrasonic sensors 4 provided in the support 35 that supports the wafer W in the transport mechanism 3. By inspecting the warped state, it is possible to prevent an abnormality in transporting the wafer W and an abnormality in processing the wafer W. In addition, by acquiring the distance to the determination member 81 by using the ultrasonic sensors 4, it is possible to inspect an abnormality of the transport mechanism 3. By performing this inspection, it is also possible to prevent the occurrence of an abnormality in transporting a wafer W. Furthermore, it is possible to reduce the burden on a worker when performing the teaching by using the ultrasonic sensors 4, as described above.

[Detection of Scratch and Particle]

For the inspections that can be performed by the substrate processing apparatus 1, the following is supplemented: by using the ultrasonic sensors 4, it is possible to detect scratches formed on the rear surface of a wafer W and/or particles adhering to the rear surface of the wafer W. The rear surface of the wafer W is scanned by moving the support 35 at a relatively low speed while emitting ultrasonic waves. In the region in which distance data is directly acquired, since the distances acquired from the positions at which scratches and particles exist are relatively significantly different from the distance acquired from a position in the vicinity of the scratches and the particles, it is possible to detect the scratches or the particles. The detection of scratches and particles may be performed in parallel with the inspection of the warped state by using, for example, the data acquired in steps S1 to S3 to perform the inspection of the warped state. In addition, the detection of scratches and particles may be performed by performing the scanning of the support 35 separately from the operations described in steps S1 to S3. Furthermore, threshold values may be set for the numbers or the sizes of scratches and particles, and the controller 100 may configured to determine not to perform the transport when the threshold values are exceeded.

In the substrate processing apparatus 1, with respect to the processing modules 7, the load-lock modules are separately provided as the load-lock module 5A for the outgoing route and the load-lock module 5B for the returning route, but only one load-lock module may be provided and have a configuration to be used for both the outgoing route and the returning route with respect to the processing modules 7. The processing modules 7 are not limited to the configuration in which the processing modules 7 are connected to the load-lock modules via the vacuum transport module 6, and may be configured to be directly connected to the load-lock modules without via the vacuum transport module 6. In addition, the processing modules 7 are not limited to a film forming module, and may be, for example, an etching module or a module that performs heat treatment (annealing treatment) in an inert gas atmosphere.

[Correction of Wafer W Receiving Position]

The substrate processing apparatus may have a configuration that is not provided with the alignment module 20. In that case, it is preferable to make the support 35 receive a wafer W according to the position of the wafer W that is acquired in step S1 described in the above-described method for inspecting the warped state of a wafer W. Specifically, as described with reference to FIG. 7, when the support 35 enters the container main body 11, the ultrasonic sensors 4 detects the point P1 at the peripheral ends of the wafer W, and further the point P2 at the center of the wafer W is calculated.

Then, the support 35 is laterally deviated from the receiving position according to the position of this point P2. That is, the positions of the support 35 in the X direction and the Y direction are adjusted such that the point P2 and the support 35 are at predetermined relative positions in a plan view. After the adjustment, the support 35 is raised to receive the wafer W. The lateral adjustment of the position for raising the support 35 (position determination) is performed by the controller 100, which is a position determinator. Since the wafer W is supported at a predetermined position of the support 35 by this position adjustment, it is possible to transport the wafer W to a desired position of the load-lock module 5A with high accuracy. Regarding the correction of the receiving position described above, unlike the above-described teaching in which, after data update, the support 35 moves to a predetermined position and receives a wafer W until the next data update, the support 35 is aligned each time a wafer is received. As described above, the position of the wafer W on the support 35 is corrected by the pressing by the rollers 47, but by correcting the receiving position, the wafer W can be more reliably located at the desired position on the support 35. The roller 47 may not be provided, and in that case, it is more effective to correct the receiving position.

Regarding the correction of the wafer W receiving position, it suffices if the positions of the peripheral end points P1 of the wafer W in the XY direction can be detected. That is, the ultrasonic sensors 4 only need to be able to detect the presence or absence of a wafer W at the upper position, and the distance from the ultrasonic sensors 4 to the wafer W does not have to be measured. Regarding the second abnormality inspection of the transport apparatus main body 39 described with reference to FIG. 16, it may be determined whether or not there is an abnormality in the transport apparatus main body 39 depending on whether the determination member is detected or not detected by the ultrasonic sensors 4 when the support 35 is disposed at a predetermined position. That is, abnormality inspection may be performed without measuring the distance to the determination member. Therefore, when only the correction of the wafer W receiving position and the abnormality inspection of the transport apparatus main body 39 as described above are performed, it is not essential to acquire the distance to the object by the ultrasonic sensors 4, and the apparatus may have a configuration in which only the inspection of an object is performed and the distance is not acquired.

The transport mechanism 3 is not limited to being provided in the loader module 2 described above, and may be provided in an environment in which ultrasonic sensors 4 can be used by transmitting ultrasonic waves. Specifically, the transport mechanism 3 may be provided in, for example, an atmosphere of an inert gas such as nitrogen gas, without being limited to the above-described air atmosphere. Therefore, the interior of the above-described loader module 2 may have an inert gas atmosphere as in the load-lock modules 5A and 5B. The transport mechanism is not limited to being configured as an articulated arm, and may have, for example, a configuration that includes a base that is rotatable around a vertical axis, movable upward and downward, and movable laterally, and the support 35 moves forward and rearward on the base. The object to be transported are not limited to the wafer W which is a circular substrate, and may be, for example, a square substrate. It should be noted that the configuration in which the distance to an object is detected by emitting ultrasonic wave from the upper side to the lower side may be adopted, but the configuration in which ultrasonic waves are emitted from the lower side to the upper side as described above is preferable.

The first placement portion of the wafer W transport source is configured such that the rear surface of a wafer W can be locally placed thereon like the support 14 of the transport container C and the lifting pins 52 of the load-lock module 5B such that the support 35 can scan the rear surface of the wafer W. The central portion of the wafer W is locally placed on the stage of the alignment module 20. Therefore, although it has been described that various inspections are performed on a wafer W in the transport container C when the wafer W is transported to the processing modules 7, the inspections may be performed on the wafer W of the alignment module 20. That is, the alignment module 20 may be used as the first placement portion. However, in order to prevent a transport abnormality between the transport container C and the alignment module 20, it is preferable to inspect the wafer W of the transfer container C. For convenience of explanation, regarding the transfer container C, the slots are numbered from top to bottom, but wafers W are not limited to be transported in this order, and the wafers W may be sequentially transferred from the bottom.

The embodiments disclosed herein should be considered to be exemplary in all respects and not restrictive. The above-described embodiments may be omitted, replaced, modified, and/or combined in various forms without departing from the scope and spirit of the appended claims.

According to the present disclosure, when transporting a substrate, it is possible to prevent the occurrence of an abnormalities in transporting the substrate and in processing the substrate at a transport destination.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate transport apparatus comprising:
  a support configured to support a substrate;
  a moving mechanism configured to move the support in a lateral direction in order to transport the substrate from a first placement portion to a second placement portion, each of the first placement portion and the second placement portion being configured to place thereon the substrate; and
  an ultrasonic sensor provided on the support, configured to detect the substrate placed on the first placement portion, configured to emit ultrasonic waves upward, and configured to detect a distance to the substrate placed on the first placement portion,
  wherein the support is further configured to be moved by the moving mechanism such that the ultrasonic waves are emitted to different positions on the substrate placed on the first placement portion,
  wherein the substrate transport apparatus further comprises: a transport determinator configured to determine whether or not to transport the substrate from the first placement portion based on the distance detected from each of the positions at which the ultrasonic waves are emitted by the ultrasonic sensor,
  wherein the moving mechanism operates such that, in a state in which the ultrasonic waves have been emitted from the ultrasonic sensor, a first step is performed, wherein the first step is detecting the distance by the ultrasonic sensor while moving the support from a transport region outside the substrate to a position that is located below the substrate and overlaps the substrate in a plan view, wherein the transport determinator is further configured to determine whether or not to transport the substrate from the first placement portion based on the distance detected in the first step, wherein, when a moving direction of the support in the first step is forward, the ultrasonic sensor includes a first ultrasonic sensor and a second ultrasonic sensor which are provided on a left side and a right side of the support, respectively, wherein the transport determinator is further configured to acquire a position of a center of the substrate based on a peripheral end position of the substrate detected in the first step, wherein, among a step in which the support is moved such that the first ultrasonic sensor moves along a first arc forming a left side of a circle centered on the center of the substrate in a plan view so that a distance to a peripheral edge portion of the substrate is acquired by the first ultrasonic sensor, and a step in which the support is moved such that the second ultrasonic sensor moves along a second arc forming a right side of the circle so that a distance to the peripheral edge portion of the substrate is acquired by the second ultrasonic sensor, one step is performed as a second step and the other step is performed as a third step following the second step, and wherein the transport determinator is further configured to determine whether or not to transport the substrate from the first placement portion based on the distances acquired in the second step and the third step.

2. The substrate transport apparatus of claim 1, wherein, in the second step, a distance to a position on the substrate closer to the center than a position at which a distance is acquired by the first ultrasonic sensor on the substrate is acquired by the second ultrasonic sensor, and in the third step, a distance to a position closer to the center than a position on the substrate at which a distance is acquired by the second ultrasonic sensor on the substrate is acquired by the first ultrasonic sensor.

3. The substrate transport apparatus of claim 1, wherein the transport determinator is further configured to determine whether to perform the second step and the third step based on distances of the substrate to the first ultrasonic sensor and the second ultrasonic sensor acquired in the first step.

4. The substrate transport apparatus of claim 1, wherein the transport determinator is further configured to re-determine whether or not to transport the substrate determined not to be transported from the first placement portion after a preset time has elapsed, or whether or not to transport the substrate determined not to be transported from the first placement portion from the first placement portion based on distances detected by emitting the ultrasonic waves to different positions again.

5. The substrate transport apparatus of claim 4, wherein the second placement portion is configured with a transport container that stores the substrate, the first placement portion is configured with a load-lock module, and the load-lock module is connected to a processing module configured to process the substrate in a vacuum atmosphere.

6. The substrate transport apparatus of claim 1, wherein the first placement portion is configured with a transport container that stores the substrate, the second placement portion is configured with a load-lock module, and the load-lock module is connected to a processing module configured to process the substrate in a vacuum atmosphere.

7. The substrate transport apparatus of claim 6, wherein the support includes:

a facing portion configured to face a side surface of the substrate supported on the support; and a presser configured to press the substrate from the side surface toward the facing portion in order to fix a position of the substrate with respect to the support.

8. The substrate transport apparatus of claim 1, wherein the moving mechanism includes a lifting mechanism configured to raise the support from a preset position below the substrate so that the support receives the substrate, and the substrate transport apparatus further comprises:

a memory configured to store information about the preset position; and an updater configured to update the information in the memory based on a position of a peripheral end of the substrate and a height of the substrate that are detected by laterally moving the support below the substrate in a state in which the ultrasonic waves are emitted from the ultrasonic sensor.

9. The substrate transport apparatus of claim 1, wherein the moving mechanism includes a lifting mechanism configured to raise the support from below the substrate so that the support receives the substrate, and the substrate transport apparatus further comprises:

a position determinator configured to determine a lateral position at which the support is raised to receive the substrate based on a position of a peripheral end of the substrate that is detected by laterally moving the support below the substrate in a state in which the ultrasonic waves are emitted from the ultrasonic sensor.

10. The substrate transport apparatus of claim 1, wherein the ultrasonic sensor is further configured to detect a determination member having a positional relationship determined with respect to the support at an arbitrary position for determining an abnormality of the support or the moving mechanism.

11. The substrate transport apparatus of claim 10, wherein the ultrasonic sensor is further configured to detect a distance to the determination member, and the substrate transport apparatus further comprises: an abnormality determinator configured to determine whether or not the support or the moving mechanism is abnormal based on the detected distance.

12. A substrate transport method comprising:

supporting a substrate by a support;

transporting the substrate from a first placement portion to a second placement portion by moving the support in a lateral direction by a moving mechanism, wherein each of the first placement portion and the second placement portion is configured to place the substrate thereon;

detecting the substrate placed on the first placement portion by an ultrasonic sensor provided on the support;

emitting ultrasonic waves upward by the ultrasonic sensor;

detecting a distance to the substrate placed on the first placement portion by the ultrasonic sensor;

moving the support by the moving mechanism such that the ultrasonic waves are emitted to different positions on the substrate placed on the first placement portion; and determining whether or not to transport the substrate from the first placement portion by a transport determinator based on the distance detected from each of the positions at which the ultrasonic waves are emitted by the ultrasonic sensor, wherein the moving mechanism operates such that, in a state in which the ultrasonic waves have been emitted from the ultrasonic sensor, a first step is performed, wherein the first step is detecting the distance by the ultrasonic sensor while moving the support from a transport region outside the substrate to a position that is located below the substrate and overlaps the substrate in a plan view, wherein the transport determinator is further configured to determine whether or not to transport the substrate from the first placement portion based on the distance detected in the first step, wherein, when a moving direction of the support in the first step is forward, the ultrasonic sensor includes a first ultrasonic sensor and a second ultrasonic sensor which are provided on a left side and a right side of the support, respectively, wherein the transport determinator is further configured to acquire a position of a center of the substrate based on a peripheral end position of the substrate detected in the first step, wherein, among a step in which the support is moved such that the first ultrasonic sensor moves along a first arc forming a left side of a circle centered on the center of the substrate in a plan view so that a distance to a peripheral edge portion of the substrate is acquired by the first ultrasonic sensor, and a step in which the support is moved such that the second ultrasonic sensor moves along a second arc forming a right side of the circle so that a distance to the peripheral edge portion of the substrate is acquired by the second ultrasonic sensor, one step is performed as a second step and the other step is performed as a third step following the second step, and wherein the transport determinator is further configured to determine whether or not to transport the substrate from the first placement portion based on the distances acquired in the second step and the third step.

* * * * *